United States Patent [19]

Davison

[11] Patent Number: 5,080,279
[45] Date of Patent: Jan. 14, 1992

[54] METHOD FOR TAPE AUTOMATED BONDING

[75] Inventor: Kerry L. Davison, Salisbury Township, Lehigh County, Pa.

[73] Assignee: AT&T Bell Laboratories, Murray Hill, N.J.

[21] Appl. No.: 544,706

[22] Filed: Jun. 27, 1990

[51] Int. Cl.⁵ .................................................. B23K 1/00
[52] U.S. Cl. ...................................... 228/103; 228/180.2; 228/212
[58] Field of Search ................. 228/103, 106, 180.2, 228/212, 44.7, 51

[56] References Cited

U.S. PATENT DOCUMENTS

| | | | |
|---|---|---|---|
| 3,765,590 | 10/1973 | Duffek et al. | 228/180.2 |
| 4,657,170 | 4/1987 | Müller | 228/106 |
| 4,979,663 | 12/1990 | Sofia et al. | 228/180.2 |

Primary Examiner—Samuel M. Heinrich
Attorney, Agent, or Firm—Richard D. Laumann

[57] ABSTRACT

Solder tape automated bonding of leads to an integrated circuit chip is performed using a constant temperature, flat faced thermode and a clamping plate to keep the leads in contact with the integrated circuit chip.

5 Claims, 1 Drawing Sheet

METHOD FOR TAPE AUTOMATED BONDING

TECHNICAL FIELD

The invention relates to a method for fabricating integrated circuit packages which includes making electrical contacts to, for example, integrated circuit chips using tape automated bonding.

BACKGROUND OF THE INVENTION

An essential step in the fabrication of integrated circuit packages is the formation of electrical contacts to the integrated circuit chip. The chip is typically mounted on a support member, commonly termed a paddle, and electrically contacted through leads from what those skilled in the art call a lead frame. The leads extend to the outside of the package. As might be expected, several techniques have been developed for making good electrical contacts between the chip and the leads. One exemplary technique forms the contacts by wire bonding. In this technique, individual wires are attached to a lead and a corresponding site on the chip; i.e., there is one site on the chip for each lead. Another exemplary technique bonds the leads directly to solder or gold bumps on the chip. The leads are typically on a metal tape with one set of leads for each chip. The latter technique of forming the contacts can be highly automated and, in its automated form, is generally referred to by those skilled in the art as Tape Automated Bonding (TAB).

Several techniques have been developed for forming bonds, i.e. electrical contacts, between the leads and the chip. One standard technique for forming bonds to gold bumps is called thermocompression bonding. In this technique, a combination of heat and pressure is used to form the electrical contact. A solid, flat-faced object, termed a thermode, is heated and used to press the leads against the chip. The combination of pressure and thermal energy forms the electrical contacts, bonds, between the chip and the leads.

Another standard technique forms the electrical contacts by using solder bumps on the chip. The leads are first positioned over the solder bumps on the chip. A thermode is heated to a temperature which is above the melting point of the solder and brought into contact with the leads. Sufficient force is used to insure that the leads intimately contact the solder bumps. After the solder melts, cooling of the thermode beings while it contacts the leads. After the temperature of the thermode has decreased enough so that the solder has solidified, the thermode is removed from contact with the leads. The now bonded device is removed from the bonding apparatus and the process repeated with the next device.

It is desirable that the heating and cooling of the thermode proceed as rapidly as possible and thermodes are therefore designed to have minimal thermal mass. An exemplary design is called a rail thermode and has two or more rails that contact the leads. Two- and four-rail thermodes will simultaneously bond leads to two and four sides of the chips, respectively. However, rail thermodes have disadvantages as compared to flat faced thermodes. For example, they are more difficult to machine than are flat-faced thermodes and are subject to wear when forces are applied. Additionally, to minimize temperature variations at the perimeter of the rails, both the structure of the rail supports and the rail widths should vary. This, of course, makes fabrication of the thermode more difficult and also makes temperature control more difficult. It would be desirable to perform tape-automated bonding using a constant temperature flat-faced thermode.

SUMMARY OF THE INVENTION

A method of manufacturing packages comprising the step of bonding a plurality of leads to sites on a substrate in which said bonding step comprises the further steps of clamping said leads into contact with said sites with a plate, said sites comprising a material; heating said sites and leads with a thermode held at constant temperature and in contact with said plate; monitoring the temperature of said plate and removing said thermode from said plate when said material has melted, and removing said plate from said leads when said material has cooled sufficiently to form bonds. In a preferred embodiment, the sites comprise solder. In a further preferred embodiment, the substrate comprises an integrated circuit chip. In another embodiment, a packaged integrated circuit chip is bonded to a printed wiring board; i.e., the substrate comprises a printed wiring board.

DETAILED DESCRIPTION

Figure 1:
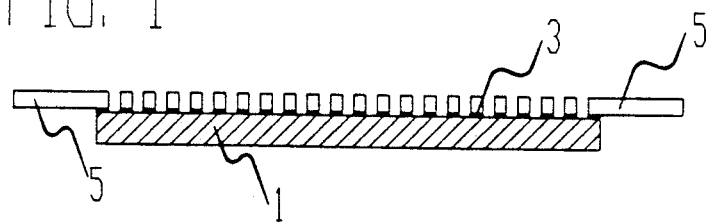
FIG. 1 is a side view of package made according to this invention.
Figure 2:
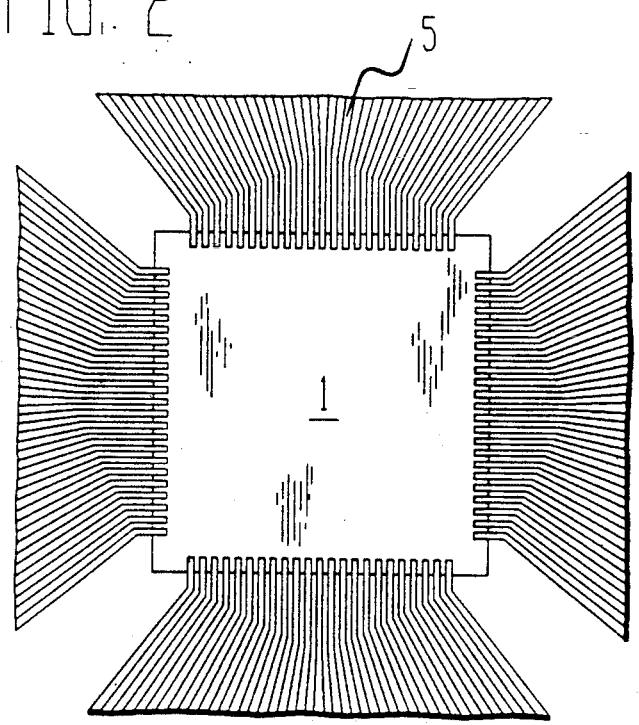
FIG. 2 is a top view of a package made according to this invention.

A side view of a portion of an integrated circuit package made according to this invention is depicted in FIG. 1. Depicted are integrated circuit chip 1, bumps 3, and a plurality of leads 5. The bumps are located at sites on the chip. Electrical contacts, e.g. bonds, are formed on the periphery of the chip at sites on the chip, e.g. substrate. The contacts between the leads and the bumps located at the sites have been formed. The sites comprise a material, e.g. solder, which melts at a relatively low temperature. A top view of the integrated circuit package is depicted in FIG. 2. Depicted are integrated circuit chip 1 and leads 5.

Methods for the manufacture of integrated circuit packages are generally well known to those skilled in the art and most of the necessary steps need not be described in detail. However, the step of bonding the leads to the chip is novel and will be discussed in detail. This step of my invention is conveniently practiced using a conventional thermocompression TAB inner head bonder. This type of equipment and its operation are well known to those skilled in the art and need not be described in detail. The bonder has a thermode which can be maintained at an essentially constant temperature. In a preferred embodiment, the thermode has an essentially flat face which should be flat to within ±5 μm. Fabrication of the thermode and of the equipment needed for temperature control will be readily accomplished by those skilled in the art. A clamping plate, typically made from any metal which has good dimensional stability and does not oxidize rapidly at high temperature, is used with means for temperature monitoring. The clamping plate should also form a good thermal path. Those skilled in the art will readily select suitable shapes, e.g. rectangular, annular, etc., for the thermode. Typical means for temperature monitoring comprise a thermocouple, although other means for temperature monitoring can be used.

Other materials and equipment needed for the practice of my invention are also well known to those skilled in the art. For example, the sites on the chips typically comprise solder in the form of bumps which are readily formed by those skilled in the art. Additionally, the metal, typically copper, tape with leads is also well known to those skilled in the art and need not be further described.

The steps of the bonding method will be described. The tape is positioned over the chip and the tape leads, e.g., fingers, are positioned over and relatively close to the solder bumps on the chip. That is, the leads are aligned with respect to the bumps. The clamping plate is then lowered onto the leads with a pressure sufficient to ensure that the leads are in intimate contact with the solder bumps. The flat-faced thermode is brought into contact with the clamping plate and heats the plate. The thermode should be at a relatively constant temperature which is greater than the melting temperature of the solder. The temperature of the clamping plate is monitored and, when the temperature of the plate is above the melting temperature of the solder and no additional thermal energy is needed to insure that the solder melts or has melted, the thermode is removed from contact with the clamping plate. The clamping plate and the solder begin to cool. When the thermocouple, or other temperature sensing means, indicates that the temperature is sufficiently low so that a bond has formed, the clamping plate is removed from contact with the leads. The bond is now complete and the device can be removed from the apparatus and bonding of the next device begun.

Figure 3:
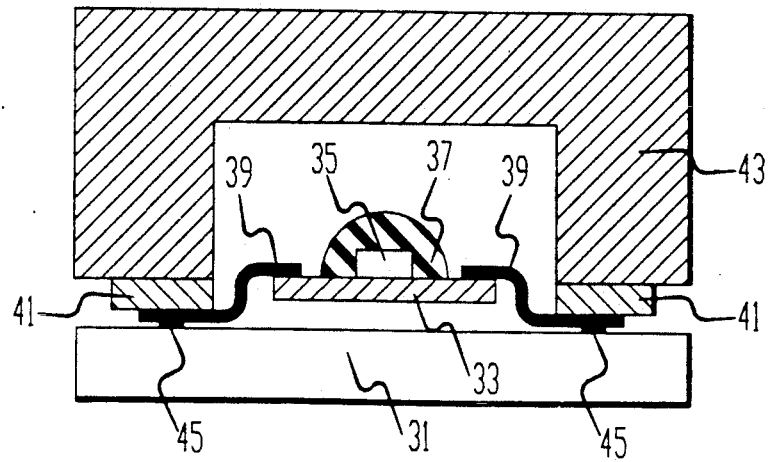
FIG. 3 is a sectional view of another package made according to this invention having a printed wiring board.

The method described may also be used to attach a surface mount integrated circuit package to a printed wiring board. Such an assembly is depicted in a sectional view in FIG. 3 which shows printed wiring board 31, lead frame 33, integrated circuit chip 35, encapsulant 37, leads 39, clamping plate 41, thermode 43, and bumps 45. The portion of thermode 43 which contacts clamping plate 41 has a flat face; thermode 43 has a small cavity in which lead frame 33 and chip 35 fit together with associated elements. The bumps are located on the printed wiring board.

The leads are positioned over the sites on the printed wiring board, e.g. substrate, which have low melting temperature material, e.g. solder, at these places. The clamping plates presses the leads against the bumps on the printed wiring board. The thermode heats the clamping plate until the material melts. The rest of the processing sequence is generally as previously described.

The method described has several advantages over a bonding method using a rail thermode. An advantage previously mentioned, but worth repeating, is that standard thermocompression bonders may be used. Only minimal changes to the heat controllers will typically be needed, and those skilled in the art will readily make such changes. As will be appreciated, the clamping plate should have a uniform temperature. This is more easily accomplished with a flat plate than with a rail thermode. For example, holes may be cut in the clamping plate at appropriate places. Such places will be readily determined by those skilled in the art. The clamping plate is more immune to buckling under the bonding forces than is a rail thermode. The list of suitable materials is thus more extensive for the clamping plate than it is for a rail thermode.

Some design considerations merit comment. The dimensions of either or both the clamping plate and the thermode may have to be adjusted to maintain a uniform temperature. For example, the thermode face may be octagonal rather than square or rectangular. Those skilled in the art will readily determine optimal shapes for particular package geometries.

Variations for the particular embodiments described will be readily thought of by those skilled in the art. For example, the apparatus may have a different orientation so that the leads are moved to contact the clamping plate, rather than vice versa. Additionally, although specific temperature sensing means have been described, if the times required for the necessary temperature rise and fall of the thermode and plate are sufficiently well understood, time may be explicitly used to monitor the temperature rather than direct temperature measurements. There is, of course, a direct correspondence between time and temperature, and the temperature monitoring is done by measuring time. The bumps may be made from materials other than solder.

I claim:

1. A method of manufacturing packages comprising the step of bonding a plurality of leads to sites on a substrate in which said bonding step comprises the further steps of clamping said leads into contact with said sites with a plate, said plate having dimensional stability, said sites comprising a material;

heating said sites and leads with a thermode held at constant temperature and in contact with said plate;

monitoring the temperature of said plate and removing the thermode from said plate when said material has melted; and, removing said plate from said leads when said material has cooled sufficiently to form bonds.

2. A method as recited in claim 1 in which said material comprises solder.

3. A method as recited in claim 2 in which said substrate comprises an integrated circuit chip.

4. A method as recited in claim 3 in which said thermode comprises a flat face.

5. A method as recited in claim 1 in which said substrate comprises a printed wiring board.

* * * * *